United States Patent
Kim et al.

(10) Patent No.: US 11,251,811 B2
(45) Date of Patent: Feb. 15, 2022

(54) ERROR CORRECTION CIRCUIT AND OPERATING METHOD THEREOF

(71) Applicant: SK hynix Inc., Gyeonggi-do (KR)

(72) Inventors: Dae Sung Kim, Gyeonggi-do (KR); Hyun Jun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/024,880

(22) Filed: Sep. 18, 2020

(65) Prior Publication Data

US 2021/0320673 A1 Oct. 14, 2021

(30) Foreign Application Priority Data

Apr. 8, 2020 (KR) .................. 10-2020-0042829

(51) Int. Cl.
| | |
|---|---|
| *H03M 13/00* | (2006.01) |
| *H03M 13/11* | (2006.01) |
| *H03M 13/39* | (2006.01) |
| *H03M 13/45* | (2006.01) |
| *H03M 13/21* | (2006.01) |

(52) U.S. Cl.
CPC ........ *H03M 13/1111* (2013.01); *H03M 13/21* (2013.01); *H03M 13/3905* (2013.01); *H03M 13/451* (2013.01)

(58) Field of Classification Search
None
See application file for complete search history.

(56) References Cited

U.S. PATENT DOCUMENTS

| | | | |
|---|---|---|---|
| 7,907,512 B1 * | 3/2011 | von der Embse | .... H04L 1/0045 370/208 |
| 8,074,147 B2 * | 12/2011 | Lee | ........ H04L 1/0053 714/758 |
| 2006/0107176 A1 * | 5/2006 | Song | ......... H03M 13/6331 714/758 |

(Continued)

FOREIGN PATENT DOCUMENTS

| | | |
|---|---|---|
| KR | 10-2015-0091484 | 8/2015 |
| KR | 10-2017-0075065 | 7/2017 |

OTHER PUBLICATIONS

Kyeongcheol Yang, Decoding of Block Turbo Codes, Mathematical Methods for Cryptography, Pohang University of Science and Technology, Sep. 4-8, 2017.

*Primary Examiner* — Mujtaba M Chaudry
(74) *Attorney, Agent, or Firm* — IP & T Group LLP

(57) ABSTRACT

An error correction circuit includes: a first error correction encoder for generating a plurality of row-codewords by performing first error correction encoding on each of a plurality of messages; a second error correction encoder for generating a plurality of column-codewords; a first error correction decoder for performing first error correction decoding on each of read row-vectors corresponding to the plurality of row-codewords, and outputting a soft information of the first error correction decoding; and a second error correction decoder for determining whether each of m-bit symbols in read column-vectors corresponding to the column-codewords is reliable, based on the soft information corresponding to each of the p-bit symbols, and performing second error correction decoding on the read column-vectors, based on the determination of whether each of the m-bit symbols is reliable.

21 Claims, 15 Drawing Sheets

(56) References Cited

U.S. PATENT DOCUMENTS

| | | | |
|---|---|---|---|
| 2011/0182381 A1* | 7/2011 | Zheng | H04L 1/0041 375/296 |
| 2014/0153625 A1* | 6/2014 | Vojcic | G06F 11/1625 375/224 |
| 2015/0039962 A1* | 2/2015 | Fonseka | H03M 13/2906 714/755 |
| 2015/0039963 A1* | 2/2015 | Fonseka | H03M 13/2918 714/755 |
| 2019/0312666 A1* | 10/2019 | Wu | H03M 13/21 |

* cited by examiner

ERROR CORRECTION CIRCUIT AND OPERATING METHOD THEREOF

CROSS-REFERENCE TO RELATED APPLICATION

The present application claims priority under 35 U.S.C. § 119(a) to Korean patent application number 10-2020-0042829, filed on Apr. 8, 2020, which is incorporated herein by reference in its entirety.

BACKGROUND

Field of Invention

The present disclosure generally relates to an error correction circuit capable of correcting an error of data, and more particularly, to an error correction circuit having improved error correction capability and an operating method of the error correction circuit.

Description of Related Art

A memory system may include a memory device capable of storing data and a controller capable of controlling the memory device according to a request of a host. The controller may program data provided from the host to the memory device, and read data stored in the memory device and then output the read data to the host.

When the controller transmits data or outputs data stored in the memory device to the host, error(s) may occur in the data, and therefore, the controller may include an error correction circuit capable of correcting such error(s).

The error correction circuit may perform encoding and decoding by using an error correction code. For example, the error correction circuit may include an error correction encoder configured to encode data provided from the host and an error correction decoder configured to decode data read from the memory device. The data provided from the host may be a message, and the data read from the memory device may be a codeword.

SUMMARY

Embodiments provide an error correction circuit having improved error correction capability and an operating method of the error correction circuit.

In accordance with an aspect of the present disclosure, there is provided an error correction circuit including: a first error correction encoder configured to generate a plurality of row-codewords by performing first error correction encoding on each of a plurality of messages; a second error correction encoder configured to organize m-bit symbols by grouping p-bit symbols in each of row-codewords in a unit of a column layer including m columns, and generate a plurality of column-codewords by performing second error correction encoding on each of symbol groups configured with m-bit symbols belonging to the same column layer among the m-bit symbols, where each of p and m is a natural number; a first error correction decoder configured to perform first error correction decoding on each of read row-vectors corresponding to the plurality of row-codewords, and output soft information of the first error correction decoding, corresponding to each of p-bit symbols in each of read row-vectors on which the first error correction decoding fails; and a second error correction decoder configured to determine whether each of m-bit symbols in read column-vectors corresponding to the column-codewords is reliable, based on the soft information corresponding to each of the p-bit symbols, and perform second error correction decoding on the read column-vectors, based on the determination of whether each of the m-bit symbols is reliable.

In accordance with another aspect of the present disclosure, there is provided a method for operating an error correction circuit, the method including: generating a plurality of row-codewords by performing first error correction encoding on each of a plurality of messages; organizing m-bit symbols by grouping p-bit symbols in each of row-codewords in a unit of a column layer including m columns, where each of p and m is a natural number; generating a plurality of column-codewords by performing second error correction encoding on each of symbol groups configured with m-bit symbols belonging to the same column layer among the m-bit symbols; performing first error correction decoding on each of read row-vectors corresponding to the plurality of row-codewords; determining whether each of m-bit symbols in read column-vectors corresponding to the column-codewords is reliable, based on soft information of the first error correction decoding, which corresponds to each of p-bit symbols in each of read row-vectors on which the first error correction decoding fails; and performing second error correction decoding on the read column-vectors, based on the determination of whether each of the m-bit symbols is reliable.

In accordance with another aspect of the present disclosure, there is provided a method for operating a decoder, the method including: decoding a plurality of codewords associated with a plurality of pages using a first error correction scheme, each codeword including a plurality of data symbols and multiple parity symbols; determining at least one reliable data symbol among data symbols corresponding to failure pages, which have been failed in the decoding, among the plurality of pages; correcting select codewords including the reliable data symbol, among the plurality of codewords using the first error correction scheme; and decoding the plurality of pages using a second error correction scheme.

BRIEF DESCRIPTION OF THE DRAWINGS

Various embodiments are described more fully hereinafter with reference to the accompanying drawings; however, features and aspects of the present invention may be arranged or configured differently than in any of the disclosed embodiments and thus the present invention is not limited to or by any of the disclosed embodiments. Rather, these embodiments are provided so that this disclosure is thorough and complete, and fully conveys the scope of the embodiments to those skilled in the art. Also, throughout the specification, reference to "an embodiment," "another embodiment" or the like is not necessarily to only one embodiment, and different references to any such phrase are not necessarily to the same embodiment(s).

In the drawing figures, dimensions may be exaggerated for clarity of illustration. It will be understood that when an element is referred to as being "between" two elements, it can be the only element between the two elements, or one or more intervening elements may also be present.

Like reference numerals refer to like elements throughout.

FIG. 1 is a diagram illustrating error correction encoding in accordance with an embodiment of the present disclosure.

FIGS. 2A to 2C are diagrams illustrating error correction decoding in accordance with an embodiment of the present disclosure.

FIG. 3 is a diagram illustrating error correction encoding in accordance with an embodiment of the present disclosure.

FIGS. 4A to 4C are diagrams illustrating error correction decoding in accordance with an embodiment of the present disclosure.

FIG. 5 is a diagram illustrating an error correction circuit in accordance with an embodiment of the present disclosure.

FIG. 6 is a flowchart illustrating an operating method of an error correction encoder in accordance with an embodiment of the present disclosure.

FIG. 7 is a flowchart illustrating an operating method of an error correction decoder in accordance with an embodiment of the present disclosure.

FIG. 8 is a diagram illustrating a memory system in accordance with an embodiment of the present disclosure.

FIG. 9 is a diagram illustrating a memory device in accordance with an embodiment of the present disclosure.

FIG. 10 is a diagram illustrating a memory block.

FIG. 11 is a diagram illustrating another example of the memory system including a memory controller, such as that shown in FIG. 8.

Figure 8:
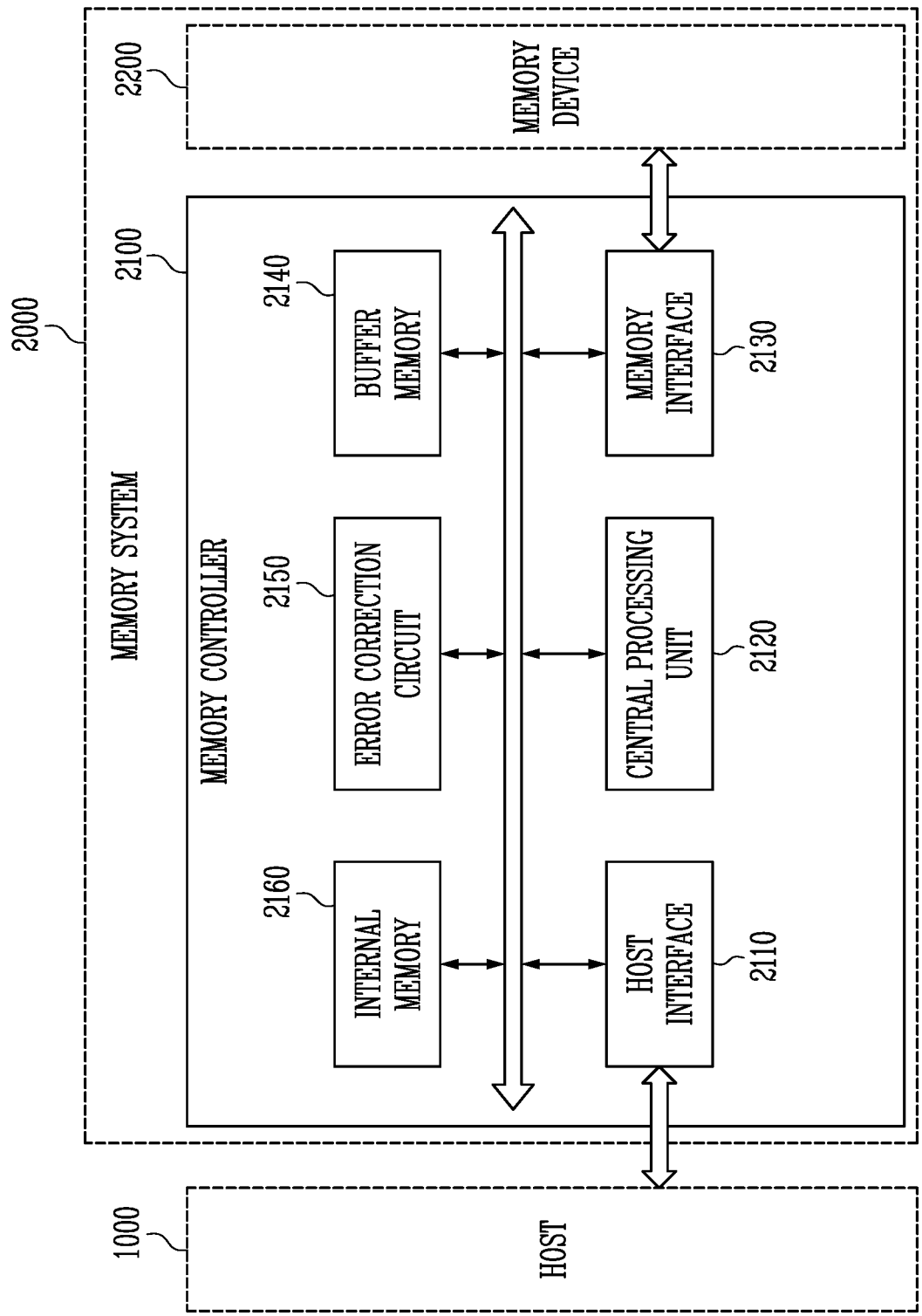
Figure 12:
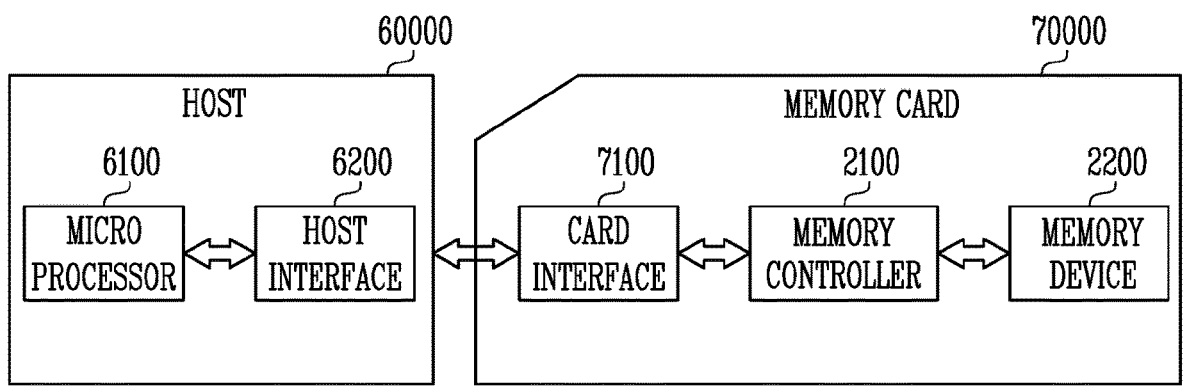

FIG. 12 is a diagram illustrating another example of the memory system including the memory controller, such as that shown in FIG. 8.

DETAILED DESCRIPTION

Figure 1:
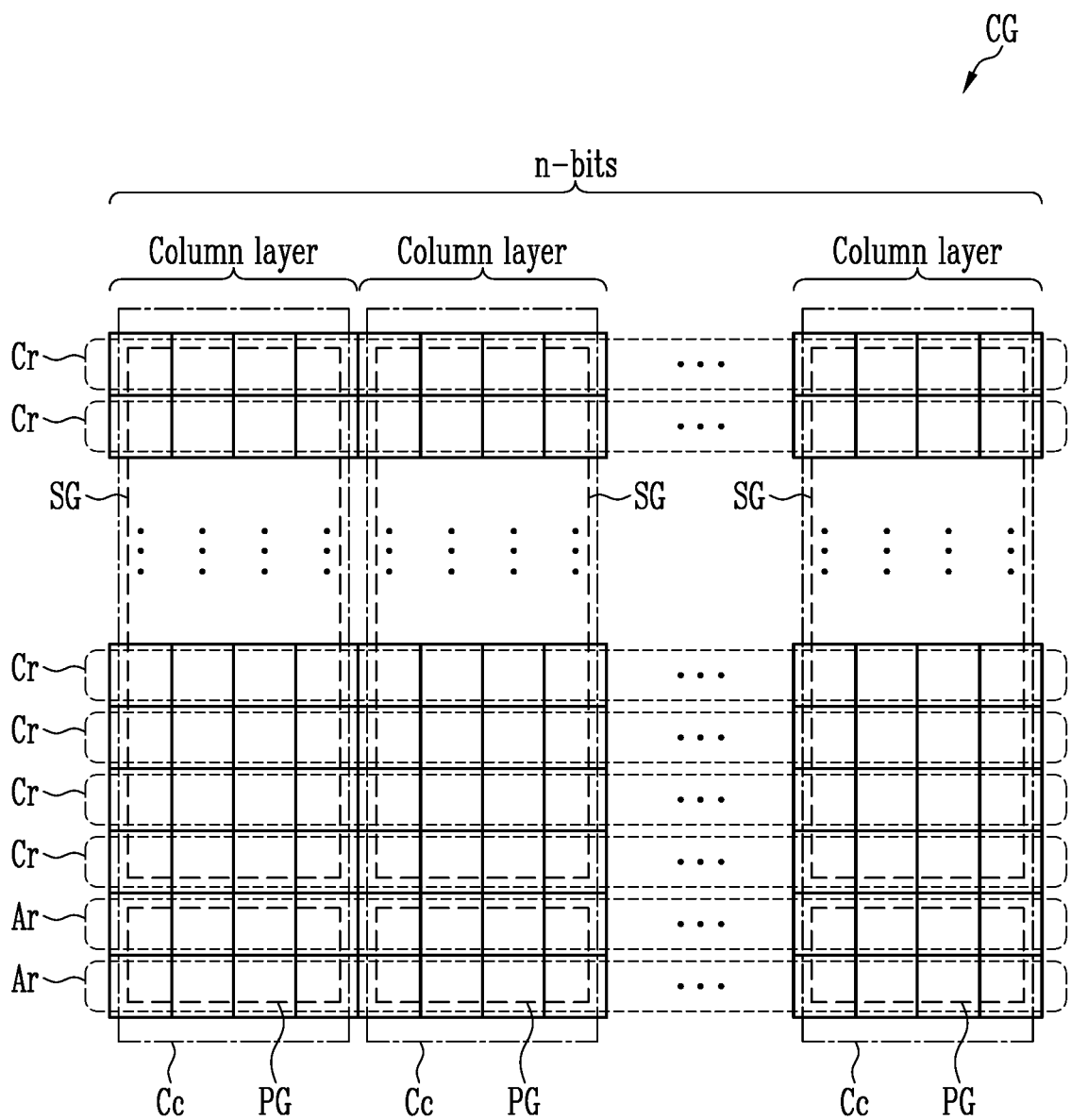

FIG. 1 is a diagram illustrating error correction encoding in accordance with an embodiment of the present disclosure.

Referring to FIG. 1, first error correction encoding may be performed on each of a plurality of messages, to generate a plurality of codewords. A codeword generated by performing the first error correction encoding on a message may be referred to as a row-codeword Cr. The first error correction encoding may be performed by using various error correction codes. Although an example in which the first error correction encoding is performed by using a binary or non-binary low density parity check (LDPC) code is illustrated in FIG. 1, the embodiments of the present disclosure are not limited thereto. When the first error correction encoding is performed, a row-codeword Cr including n symbols (comprised of bits) may be generated. Here, n may be a natural number.

Second error correction encoding may be performed on each symbol group SG, which includes symbols belonging to the same column layer among symbols in a plurality of row-codewords Cr, to generate a plurality of codewords. The column layer may include a plurality of columns. Although an example in which each column layer includes 4 bits is illustrated in FIG. 1, the present disclosure is not limited thereto.

A codeword generated by performing the second error correction encoding on each symbol group SG belonging to the same column layer may be referred to as a column-codeword Cc. The second error correction encoding may be performed by using various error correction codes. For example, the second error correction encoding may be performed by using a maximum distance separable (MDS) code. The MDS code may include, for example, a Reed-Solomon (RS) code, an extended RS code, and/or a doubly extended RS code, but the embodiments of the present disclosure are not limited thereto. As a result of the second error correction encoding, additional rows Ar may be generated. Here, A may be a natural number of 2 or more. One column-codeword Cc may include one symbol group SG and one parity group PG, and one parity group PG may include m-bit symbols. Here, m may be a natural number of 2 or more and less than n. A group including all of the plurality of row-codewords Cr and the additional rows Ar may be referred to as a codeword group CG. That is, the codeword group CG may include a plurality of row-codewords Cr and a plurality of column-codewords Cc.

Figure 2A:
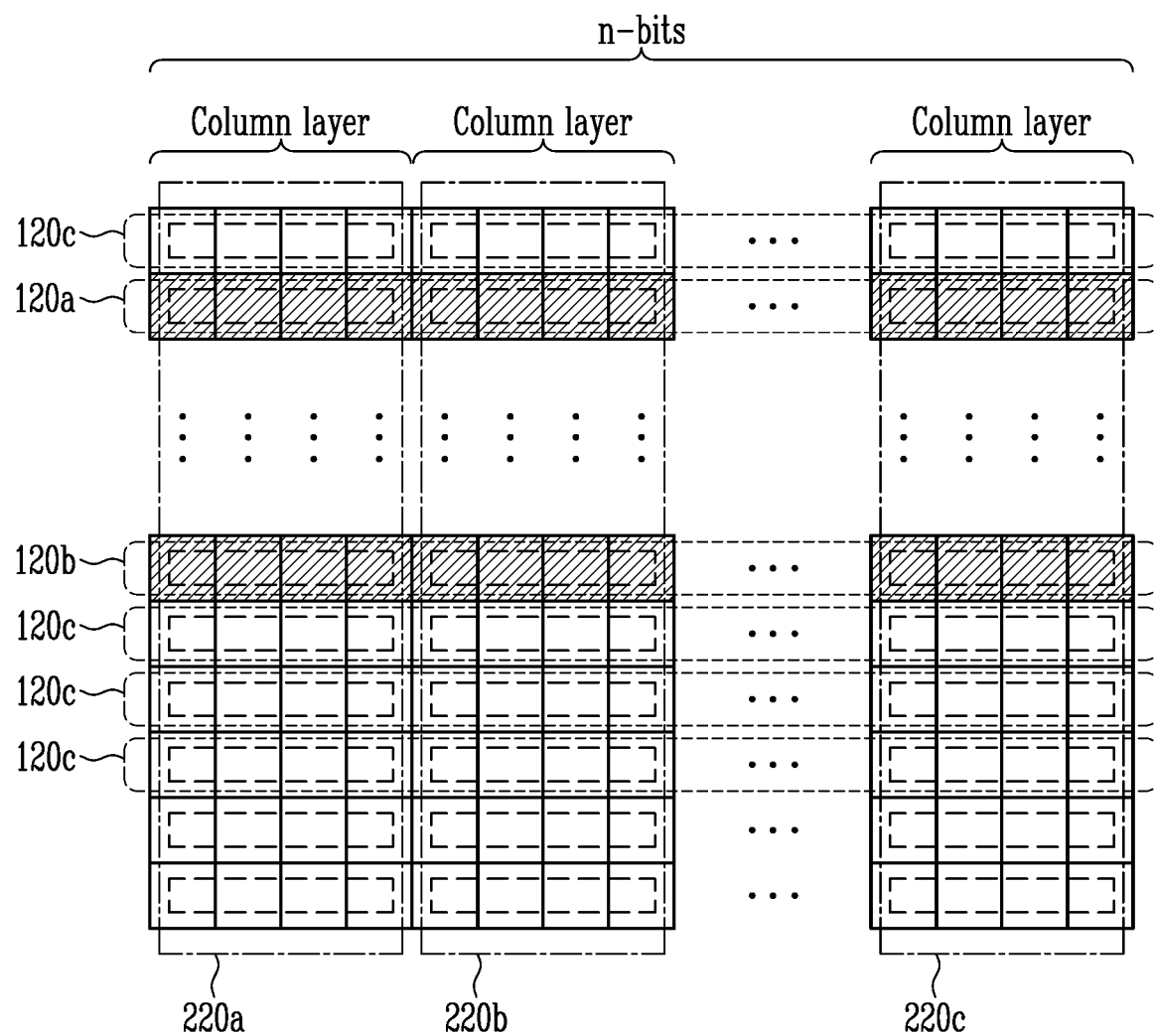
Figure 2B:
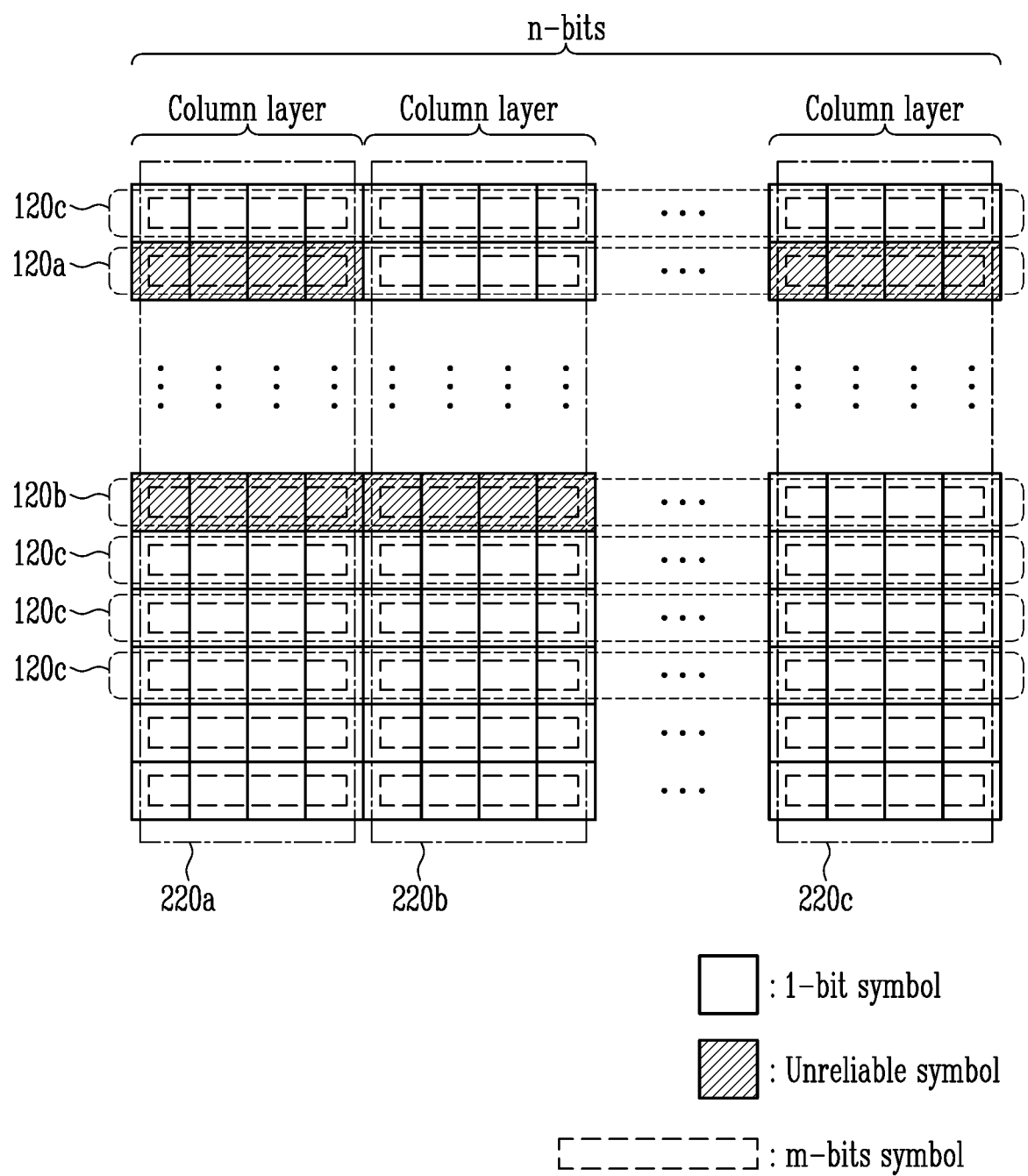
Figure 2C:
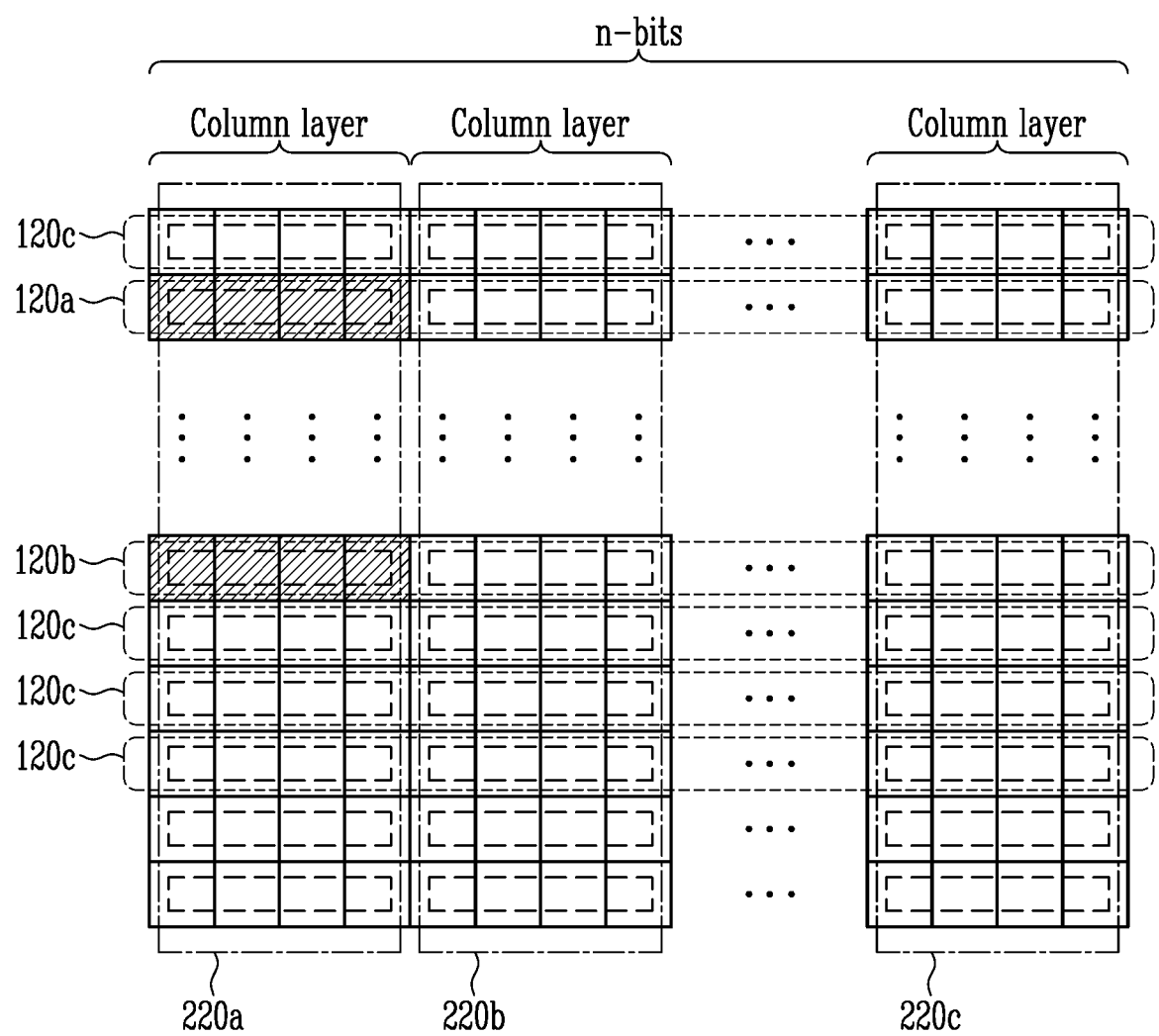

FIGS. 2A to 2C are diagrams illustrating error correction decoding in accordance with an embodiment of the present disclosure.

FIG. 2A illustrates read row-vectors $120a$, $120b$, and $120c$ correspond to the plurality of row-codewords Cr described with reference to FIG. 1 and read column-vectors $220a$, $220b$, and $220c$ correspond to the plurality of column-codewords Cc described with reference to FIG. 1. Each of the read row-vectors $120a$, $120b$, and $120c$ may include n symbols.

A first error correction decoding may be performed on a target read row-vector $120a$ corresponding to a target row-codeword among the row-codewords Cr. For example, the first error correction decoding may be performed by using a binary LDPC code or a non-binary LDPC code, but the embodiments of the present disclosure are not limited thereto.

When the first error correction decoding on the target read row-vector $120a$ fails, all symbols in the target read row-vector $120a$ may be determined as unreliable symbols.

The first error correction decoding may be performed on read row-vectors corresponding to the other row-codewords except the target row-codeword among the row-codewords (e.g., Cr shown in FIG. 1) included in the codeword group (e.g., CG shown in FIG. 1). In the following description, for convenience, the other row-codewords except the target row-codeword are designated as reference row-codewords, and the read row-vectors corresponding to the reference row-codewords are designated as reference read row-vectors $120b$ and $120c$.

Consider a case in which, among reference read row-vectors $120b$ and $120c$, the first error correction decoding on reference read row-vector $120b$ fails and the first error correction decoding on reference read row-vector $120c$ succeeds. All symbols in the reference row-vector $120b$ on which the first error correction decoding fails may be determined as unreliable symbols. All symbols in the reference row-vectors $120c$ on which the first error correction decoding succeeds may be determined as reliable symbols.

Therefore, it may be determined whether each of m-bit symbols in the read column-vectors $220a$, $220b$, and $220c$ is reliable. A reliability of each of the m-bit symbols may be determined based on soft information or soft read data of the first error correction decoding. Hereinafter, reliability is determined based on the soft information, but the present disclosure is not limited thereto.

In an embodiment, when the first error correction decoding is performed based on a bit flipping (BF) algorithm, the soft information may include a flipping function value of a variable node corresponding to each of symbols. For example, when a flipping function value is less than or equal to a first setting value (which may be a positive number or negative number), a symbol may have reliability.

In an embodiment, when the first error correction decoding is performed base on a min-sum (MS) algorithm, the soft information may include a posteriori probability (APP) of a variable node corresponding to each of the symbols. For example, a symbol corresponding to a variable node of which APP is greater than or equal to a second setting value may be determined as that the symbol is reliable.

Reliable m-bit symbols may be determined among m-bit symbols in the read column-vectors $220a$ and $220b$. For example, when it is determined that symbols of which number is greater than or equal to a set number are reliable among m symbols in the m-bit symbols, it may be determined that the m-bit symbols are reliable. For example, when it is determined that all symbols in the m-bit symbols are reliable or when it is determined that a majority of symbols among the symbols in the m-bit symbols are reliable, it may be determined that the m-bit symbols are reliable.

According to the determination of reliability, a number of m-bit symbols which are unreliable among the m-bit symbols in each of the read column-vectors 220a, 220b, and 220c may be decreased as shown in FIG. 2B.

A second error correction decoding may be performed on each of the read column-vectors 220a, 220b, and 220c. For example, the second error correction decoding may be performed by using an MDS code, but the embodiments of the present disclosure are not limited thereto.

The second error correction decoding may include error decoding or erasure decoding.

In an embodiment, when a number of symbols determined as unreliable symbols among the m-bit symbols in each of the read column-vectors 220a, 220b, and 220c is less than an erasure correction capability of the MDS code, the erasure decoding may be performed. When the erasure correction capability of the MDS code is defined as A, a number of the additional rows described in FIG. 1 may be A. In an embodiment, when a number of symbols determined as unreliable symbols among the m-bit symbols in each of the read column-vectors 220a, 220b, and 220c is less than or equal to B as an error correction capability of the MDS code, the error decoding may be performed. Here, B may be a half of A (i.e., A/2).

Consider a case in which the second error correction decoding on the read column-vector 220a fails, and the second error correction decoding on the read column-vectors 220b and 220c succeeds.

When the second error correction decoding on the read column-vectors 220b and 220c succeeds, any unreliable symbol may not exist among all the m-bit symbols in the read column-vectors 220b and 220c as shown in FIG. 2C. Therefore, as shown in FIG. 2C, a number of unreliable symbols among the symbols in the read row-vectors 120a and 120b may decrease. Subsequently, the first error correction decoding on the target read row-vector 120a may be performed. Since a number of unreliable symbols among the symbols in the target read row-vector 120a decreases, the success probability of the first error correction decoding can increase.

Figure 3:
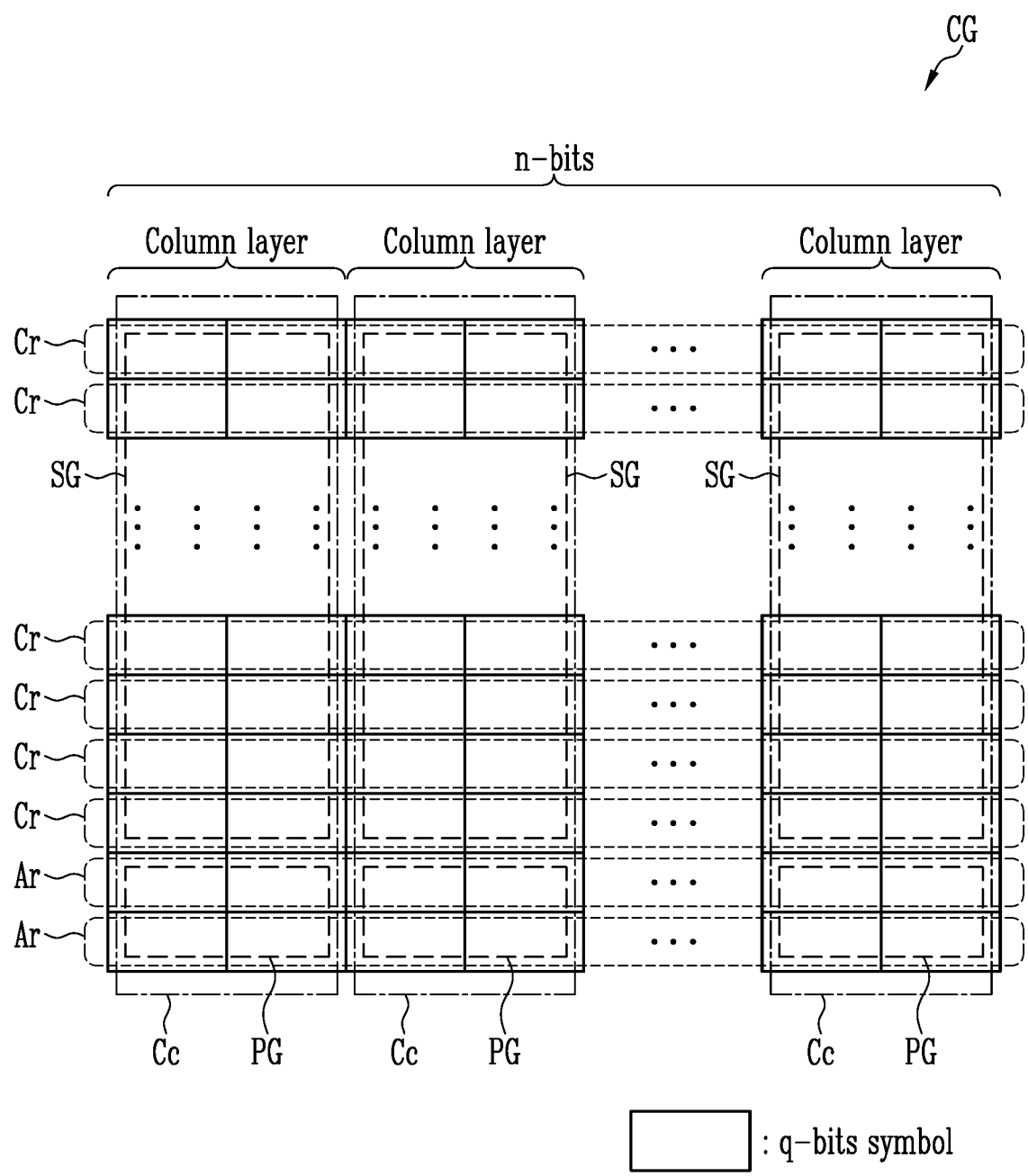

FIG. 3 is a diagram illustrating error correction encoding in accordance with an embodiment of the present disclosure.

Referring to FIG. 3, first error correction encoding may be performed on each of a plurality of messages, to generate a plurality of codewords. A codeword generated by performing the first error correction encoding on a message may be referred to as a row-codeword Cr. The first error correction encoding may be performed by using various error correction codes. Although an example in which the first error correction encoding is performed by using a non-binary low density parity check (LDPC) code is illustrated in FIG. 3, the embodiments of the present disclosure are not limited thereto. When the first error correction encoding is performed by using the non-binary LDPC code, a row-codeword Cr including n/q q-bit symbols may be generated. Here, n may be a natural number, and q may be a natural number of 2 or more and less than n.

Second error correction encoding may be performed on each symbol group SG, which is configured with q-bit symbols belonging to the same column layer among q-bit symbols in a plurality of row-codewords Cr, to generate a plurality of codewords. The column layer may include a plurality of columns, and an example in which there are two columns per one column layer is illustrated in FIG. 3. A codeword generated by performing the second error correction encoding on each symbol group SG, which is configured with q-bit symbols belonging to the same column layer, may be referred to as a column-codeword Cc. The second error correction encoding may be performed by using various error correction codes. For example, the second error correction encoding may be performed by using a maximum distance separable (MDS) code. As a result of the second error correction encoding, additional rows Ar may be generated. Here, A may be a natural number of 2 or more. One column-codeword Cc may include one symbol group SG and one parity group PG, and one parity group PG may include A m-bit symbols. Here, m is a multiple of q. A group including all of the plurality of row-codewords Cr and the additional rows Ar may be referred to as a codeword group CG. That is, the codeword group CG may include a plurality of row-codewords Cr and a plurality of column-codewords Cc.

Figure 4A:
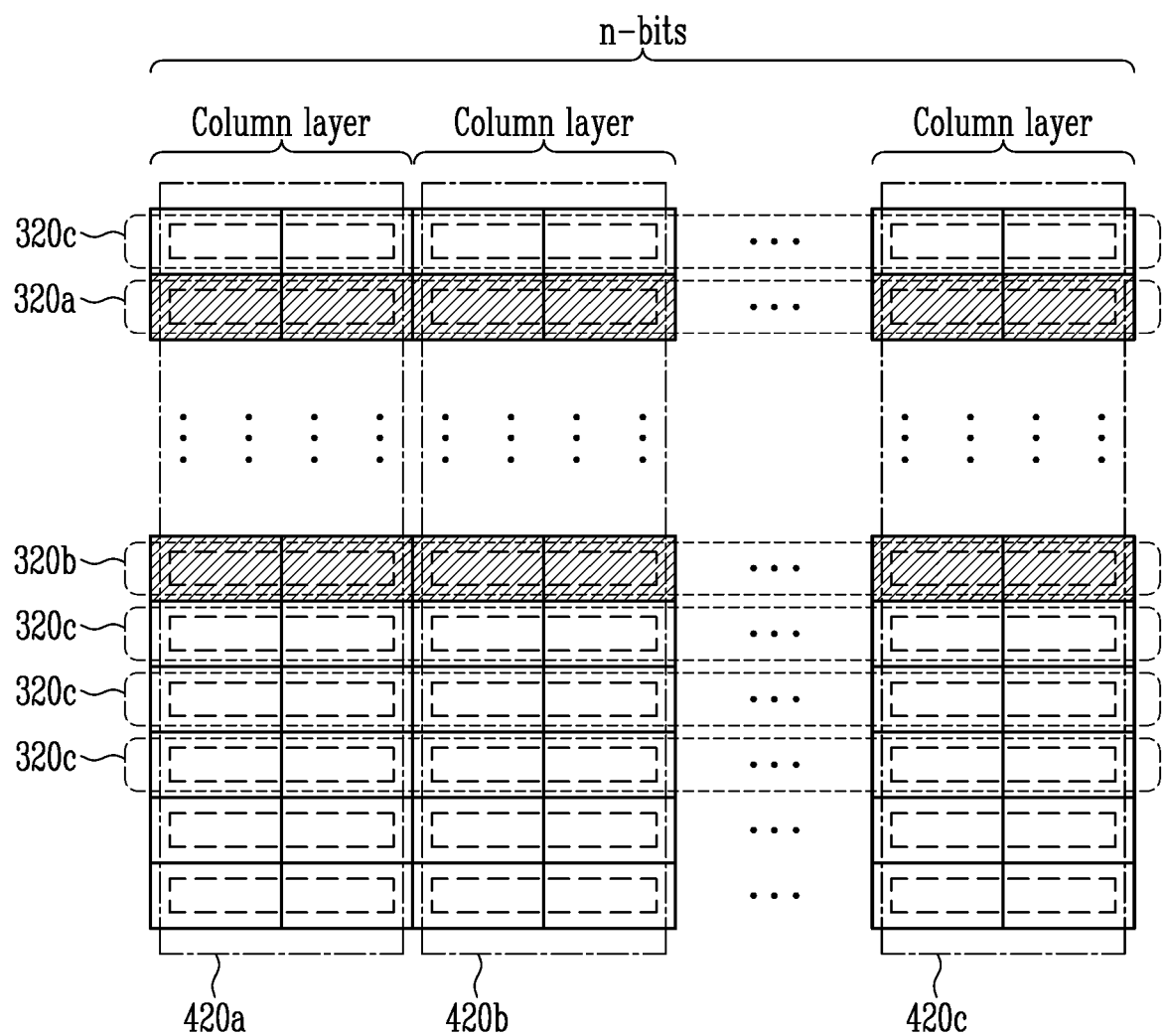
Figure 4B:
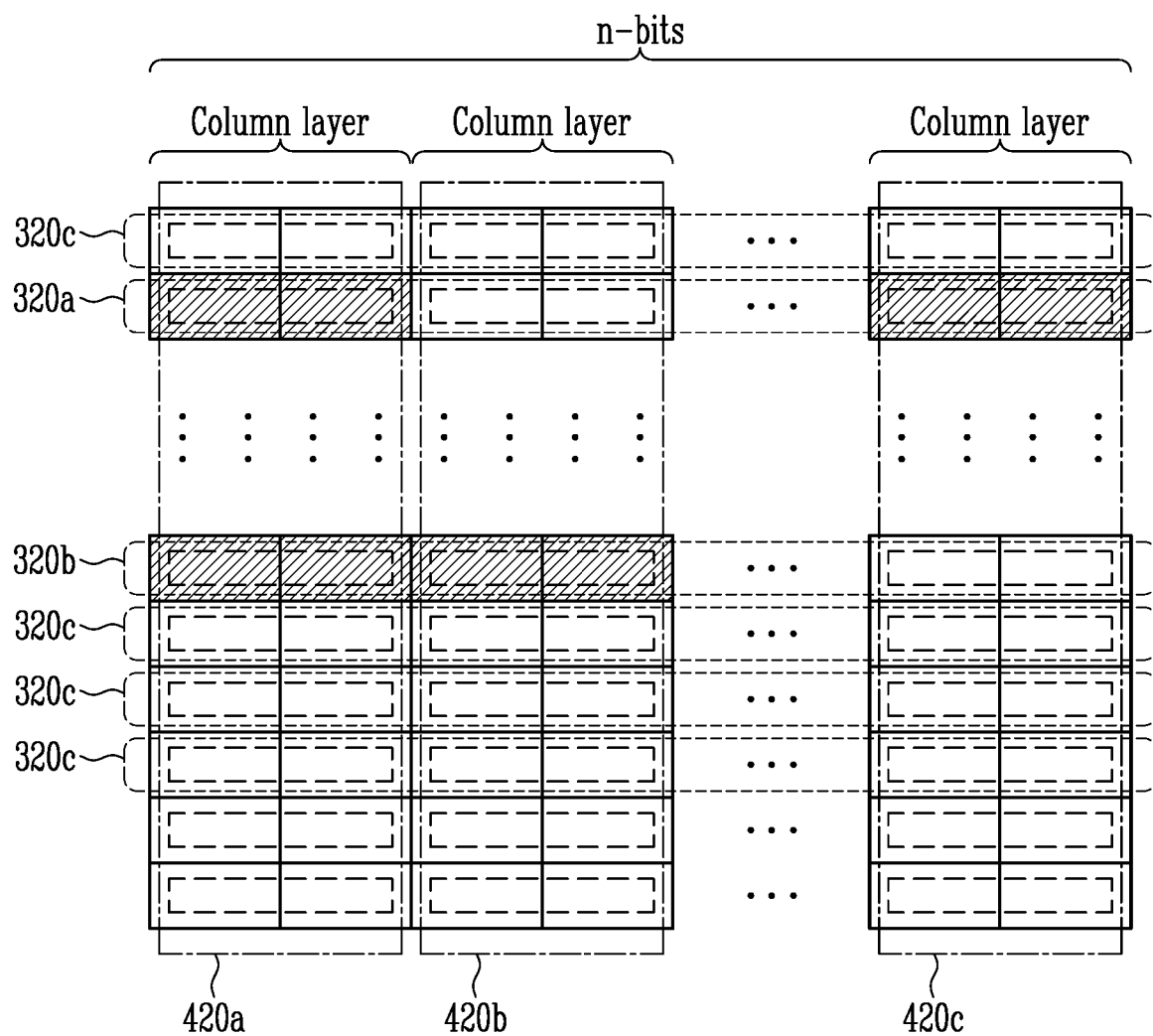
Figure 4C:
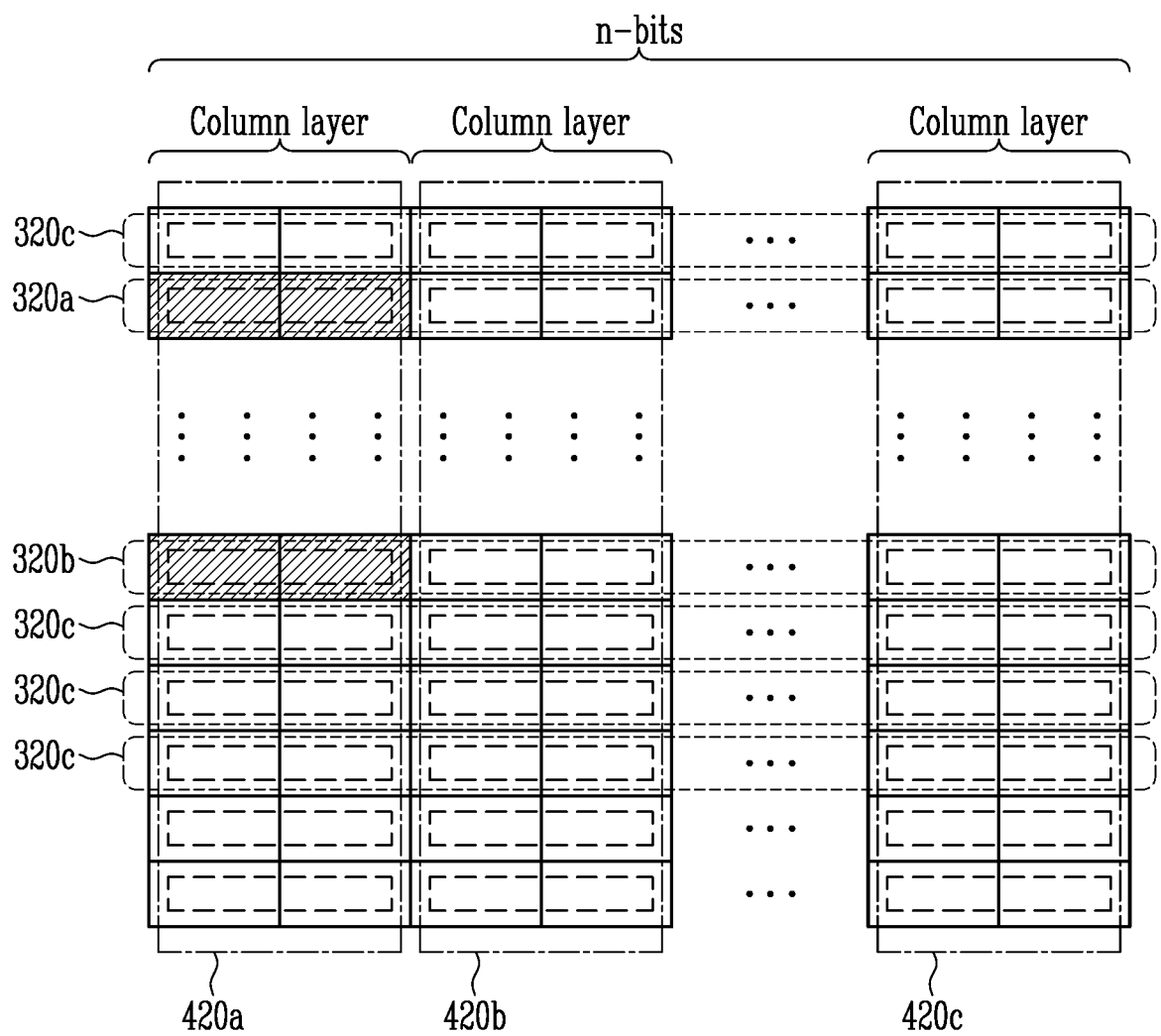

FIGS. 4A to 4C are diagrams illustrating error correction decoding in accordance with an embodiment of the present disclosure.

Referring to FIG. 4A, read row-vectors 320a, 320b, and 320c correspond to the plurality of row-codewords Cr described with reference to FIG. 3 and read column-vectors 420a, 420b, and 420c correspond to the plurality of column-codewords Cc described with reference to FIG. 3. Each of the read row-vectors 320a, 320b, and 320c may include n/q q-bit symbols. Here, n may be a natural number, and q may be a natural number of 2 or more and less than n.

A first error correction decoding may be performed on a target read row-vector 320a corresponding to a target row-codeword among the row-codewords Cr. For example, the first error correction decoding may be performed by using a non-binary LDPC code, but the embodiments of the present disclosure are not limited thereto.

The first error correction decoding may be performed in a unit of a q-bit symbol. Here, q may be any submultiple, except 1, among submultiples of m.

When the first error correction decoding on the target row-vector 320a fails, all q-bit symbols in the target read row-vector 320a may be determined as unreliable symbols.

The first error correction decoding may be performed on reference read row-vectors 320b and 320c corresponding to the other reference row-codewords except the target row-codeword among the row-codewords in the codeword group. Consider a case in which, among reference read row-vectors 320b and 320c, the first error correction decoding on the reference read row-vector 320b fails and the first error correction decoding on the reference read row-vector 320c succeeds. All q-bit symbols in the reference read row-vector 320b on which the first error correction decoding fails may be determined as unreliable symbols. All q-bit symbols in the reference row-vectors 320c on which the first error correction decoding succeeds may be determined as reliable symbols.

Therefore, it may be determined whether each of m-bit symbols in the read column vectors 420a, 420b, and 420c is reliable. A reliability of each of the m-bit symbols may be determined based on soft information of the first error correction decoding. Hereinafter, reliability is determined based on the soft information, but the present disclosure is not limited thereto.

In an embodiment, when the first error correction decoding is performed based on a symbol flipping algorithm, the soft information may include a flipping function value of a variable node corresponding to each of q-bit symbols. For example, a q-bit symbol corresponding to a variable node of which flipping function value is greater than or equal to a first setting value may be determined as reliable.

In an embodiment, when the first error correction decoding is performed based on a min-sum (MS) algorithm, the soft information may include a posteriori probability (APP) of a variable node corresponding to each of the q-bit symbols. For example, a q-bit symbol corresponding to a variable node of which APP is greater than or equal to a second setting value may be determined as reliable.

Reliable m-bit symbols among the m-bit symbols in the read column-vectors 420a, 420b, and 420c may be determined. For example, when it is determined that q-bit symbols, the number of which is greater than or equal to a set number among m/q q-bit symbols in an m-bit symbol are reliable, the m-bit symbol may be determined as reliable. For example, when it is determined that all q-bit symbols in the m-bit symbols are reliable or when it is determined that a majority of q-bit symbols among the q-bit symbols in the m-bit symbols are reliable, it may be determined that the m-bit symbols are reliable.

According to the determination of reliability, a number of m-bit symbols which are unreliable among the m-bit symbols in each of the read column-vectors 420a, 420b, and 420c may be decreased as shown in FIG. 4B.

A second error correction decoding may be performed on each of the read column-vectors 420a, 420b, and 420c. For example, the second error correction decoding may be performed by using an MDS code, but the embodiments of the present disclosure are not limited thereto.

The second error correction decoding may include error decoding or erasure decoding. In an embodiment, when a number of symbols determined as unreliable symbols among the m-bit symbols in each of the read column-vectors 420a, 420b, and 420c is less than an erasure correction capability of the MDS code, the erasure decoding may be performed. When the erasure correction capability of the MDS code is defined as A, a number of the additional rows described in FIG. 3 may be A. In an embodiment, when a number of symbols determined as unreliable symbols among the m-bit symbols in each of the read column-vectors 420a, 420b, and 420c is less than or equal to B as an error correction capability of the MDS code, the error decoding may be performed regardless of the position of an error. Here, B may be a half of A (i.e., A/2).

Consider a case in which the second error correction decoding on the read column-vector 420a fails, and the second error correction decoding on the read column-vector 420b and 420c succeeds.

When the second error correction decoding on the read column-vectors 420b, and 420c succeeds, all the m-bit symbols in the read column-vectors 420b and 420c may become reliable symbols as shown in FIG. 4C. Therefore, as shown in FIG. 4C, a number of unreliable symbols among the m-bit symbols in the read row-vectors 320a and 320b may decrease. Subsequently, the first error correction decoding on the target read row-vector 320a may be performed. Since a number of unreliable symbols among the m-bit symbols in the target read row-vector 320a decreases, the probability that the first error correction decoding will succeed increases.

Figure 5:
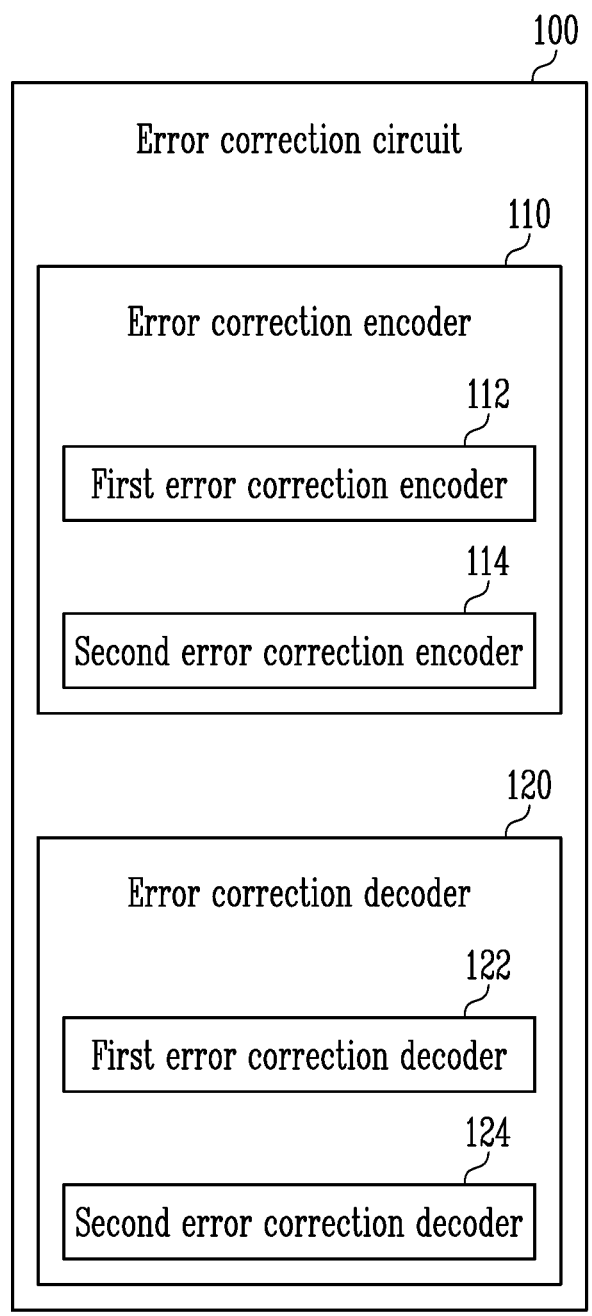

FIG. 5 is a diagram illustrating an error correction circuit 100 in accordance with an embodiment of the present disclosure.

Referring to FIG. 5, the error correction circuit 100 may include an error correction encoder 110 and an error correction decoder 120.

The error correction encoder 110 may generate a codeword by performing error correction encoding on original data, and output the generated codeword to a channel. The error correction encoder 110 may include a first error correction encoder 112 and a second error correction encoder 114.

The first error correction encoder 112 may perform first error correction encoding on a plurality of messages. For example, the first error correction encoder 112 may generate a plurality of row-codewords by using the plurality of messages and a generator matrix of an error correction code. In some embodiments, the first error correction encoder 112 may generate a plurality of row-codewords by using the plurality of messages and a parity check matrix of an error correction code. In the first error correction encoding, a binary LDPC code or a non-binary LDPC code may be used. When the binary LDPC code is used, each of the row-codewords may include n symbols. When the non-binary LDPC code is used, each of the row-codewords may include n/q q-bit symbols. Here, n may be a natural number, and q may be a natural number of 2 or more and less than n.

The second error correction encoder 114 may group the symbols in the plurality of row-codewords into symbol groups.

When the binary LDPC code is used in the first error correction decoding, the second error correction encoder 114 may organize m-bit symbols by grouping symbols in each of the plurality of row-codewords in a unit of a column layer including m columns. Here, m may be a natural number. The second error correction encoder 114 may organize a plurality of symbol groups by grouping m-bit symbols belonging to the same column layer among the m-bit symbols in the plurality of row-codewords. When each of the row-codewords includes n bits, n/m symbol groups may be generated.

When the non-binary LDPC code is used in the first error correction encoding, the second error correction encoder 114 may organize m-bit symbols by grouping q-bit symbols in each of the plurality of row-codewords in a unit of a column layer including m columns. The second error correction encoder 114 may organize a plurality of symbol groups by grouping m-bit symbols belonging to the same column layer among the q-bit symbols in the plurality of row-codewords. When each of the row-codewords includes n/q q-bit symbols, n/m symbol groups may be generated.

The second error correction encoder 114 may generate a plurality of column-codewords by performing second error correction encoding on each of the n/m symbol groups. Each of the column-codewords may include one symbol group and one parity group, the latter of which may include A m-bit symbols. A group including all of the plurality of row-codewords and the plurality of column-codewords may be referred to as a codeword group. The second error correction encoder 114 may output the codeword group to the channel.

The error correction decoder 120 may perform error correction decoding on a read vector received from the channel. The error correction decoder 120 may include a first error correction decoder 122 and a second error correction decoder 124.

The first error correction decoder 122 may receive, from the channel, a target read row-vector corresponding to a target row-codeword among the plurality of row-codewords, and perform first error correction decoding on the received target read row-vector. When the first error correction encoding is performed by using the binary LDPC code, the first error correction decoding may be performed by using the binary LDPC code. When the first error correction encoding is performed by using the non-binary LDPC code, the first error correction decoding may be performed by using the non-binary LDPC code.

When the first error correction decoding on the target read row-vector fails, the first error correction decoder 122 may receive, from the channel, reference read row-vectors corresponding to reference row-codewords as the other row-codewords, except the target row-codeword, among the row-codewords belonging to the codeword group. Further, the first error correction decoder 122 may perform the first error correction decoding on each of the received reference read row-vectors.

The first error correction decoder 122 may provide the second error correction decoder 124 with soft information of the first error correction decoding, which corresponds to the target read row-vector, and soft information of the first error correction decoding, which corresponds to each of reference read row-vectors of which first error correction decoding fails. For example, when the first error correction decoding is performed by using the binary LDPC code, the first error correction decoder 122 may provide the second error correction decoder 124 with soft information of the first error correction decoding, which corresponds to each of symbols in the target read row-vector, and soft information of the first error correction decoding, which corresponds to each of symbols in the reference read row-vector of which first error correction decoding fails. For example, when the first error correction decoding is performed by using the non-binary LDPC code, the first error correction decoder 122 may provide the second error correction decoder 124 with soft information of the first error correction decoding, which corresponds to each of q-bit symbols in the target read row-vector, and soft information of first error correction decoding, which corresponds to the reference read row-vector of which first error correction decoding fails.

The second error correction decoder 124 may determine whether each of m-bit symbols in a read column-vector corresponding to each of the column-codewords belonging to the codeword group is reliable, based on soft information received from the first error correction decoder 122.

For example, when the first error correction decoding is performed by using the binary LDPC code, the second error correction decoder 124 may determine whether m-bit symbols included in a read column-vector are reliable, based on soft information corresponding to each symbol.

For example, when it is determined that all symbols in an m-bit symbol are reliable or when it is determined that a majority of symbols among the symbols in the m-bit symbol are reliable, it may be determined that the m-bit symbol is reliable.

For example, when the first error correction decoding is performed by using the non-binary LDPC code, the second error correction decoder 124 may determine whether m-bit symbols in a read column-vector are reliable, based on soft information corresponding to each q-bit symbol. For example, when it is determined that a set number or more of q-bit symbols among m/q q-bit symbols in an m-bit symbol are reliable, it may be determined that the m-bit symbol is reliable. For example, when it is determined that all q-bit symbols in m-bit symbols are reliable or when it is determined that a majority of q-bit symbols among the q-bit symbols in the m-bit symbols are reliable, it may be determined that the m-bit symbols are reliable.

After an m-bit symbol is determined as reliable among the m-bit symbols in the read column vector is thus set as not an error symbol, the second error correction decoder 124 may perform second error correction decoding on the read column-vector.

The second error correction decoding may include at least one of error decoding and an erasure decoding.

The second error correction decoder 124 may perform the erasure decoding on a read column-vector in which a number of m-bit symbols determined to be unreliable, among the m-bit symbols in the read column-vector, is less than an erasure correction capability of the MDS code. When the erasure correction capability of the MDS code is defined as A unreliable m-bit symbols, A may be a natural number.

When the number of m-bit symbols determined to be unreliable, among the m-bit symbols in the read column-vector, is less than or equal to B as an error correction capability of the MDS code, the second error correction decoder 124 may perform the error decoding on the read column-vector.

The second error correction decoder 124 may provide the first error correction decoder 122 with information on a symbol corrected as a result of the second error correction decoding.

The first error correction decoder 122 may correct some of symbols in target read row-vectors, based on the result of the second error correction decoding, and perform the first error correction decoding on a target read row-vector including the corrected symbol.

Figure 6:
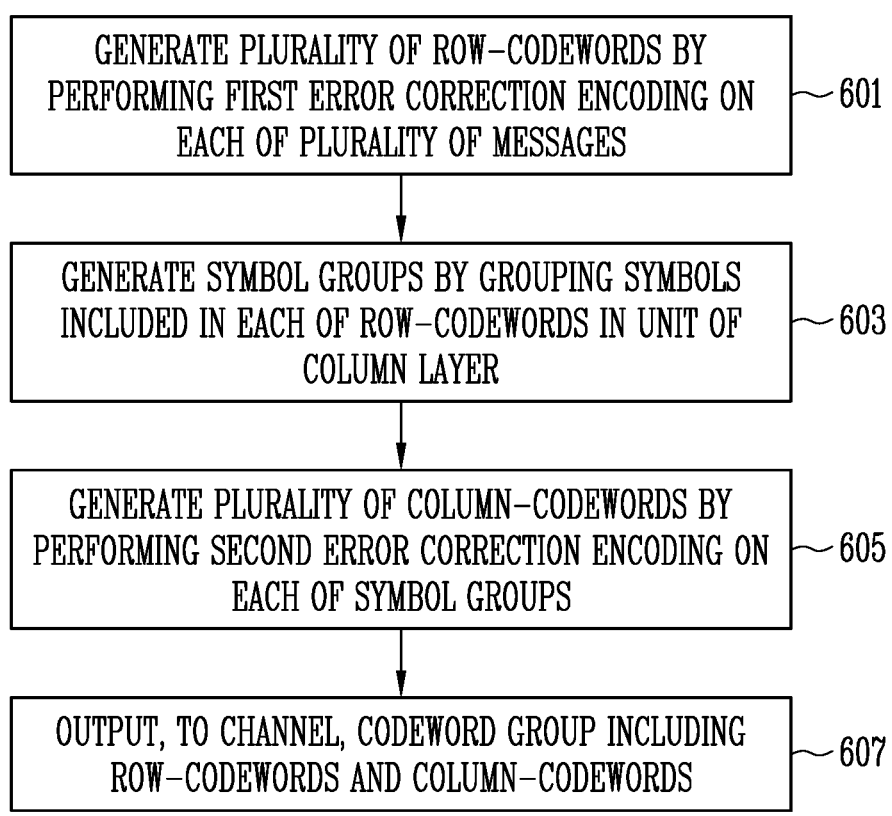

FIG. 6 is a flowchart illustrating an operating method of the error correction encoder 110 in accordance with an embodiment of the present disclosure.

Referring to FIG. 6, in step 601, the error correction encoder 110 may generate a plurality of row-codewords by performing first error correction encoding on each of a plurality of messages.

In step 603, the error correction encoder 110 may generate a plurality of symbol groups by grouping symbols in each of the plurality of row-codewords in a unit of a column layer.

In step 605, the error correction encoder 110 may generate a plurality of column-codewords by performing second error correction encoding on each of the plurality of symbol groups.

In step 607, the error correction encoder 110 may output, to a channel, a codeword group including the row-codewords and the column-codewords.

Figure 7:
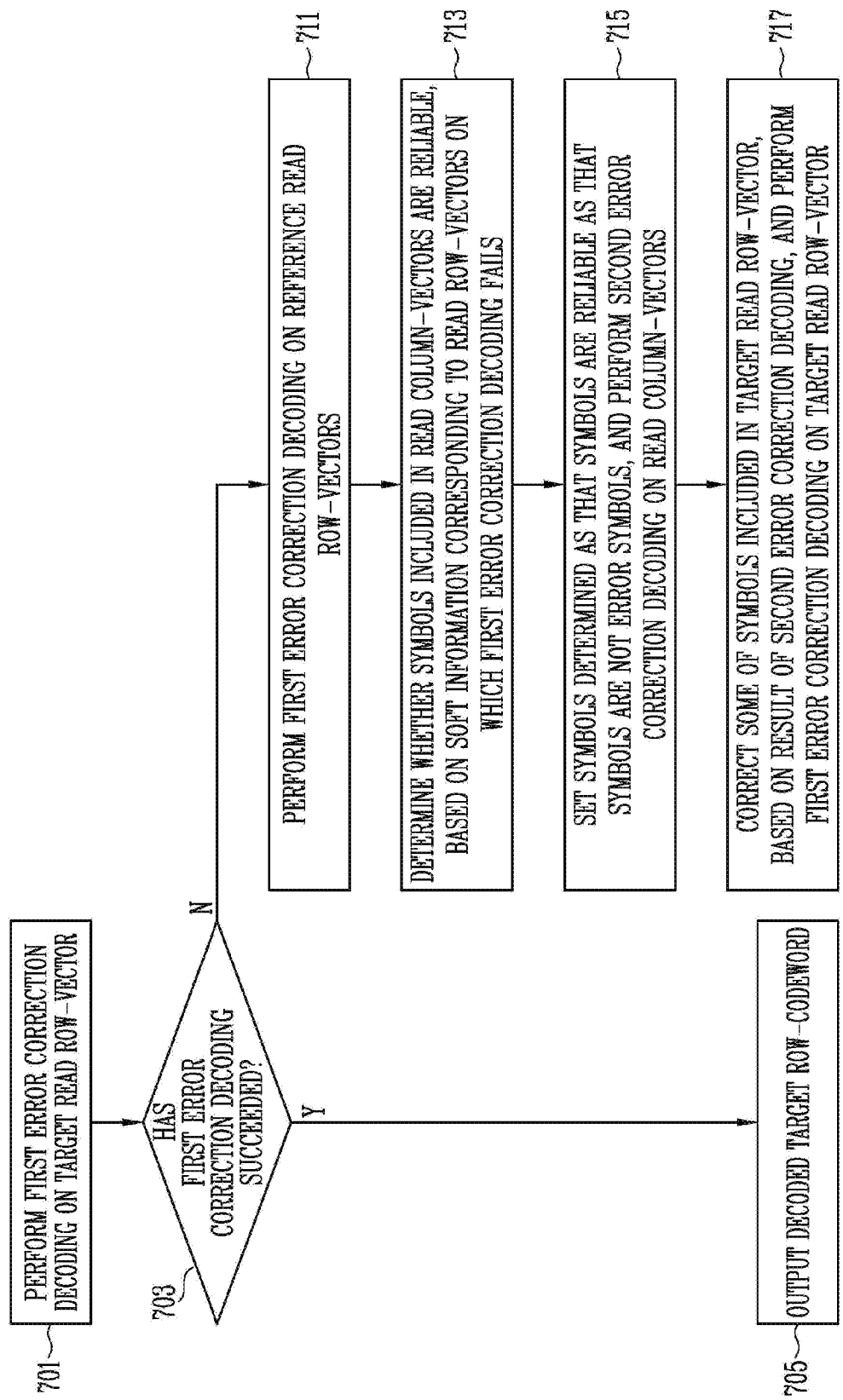

FIG. 7 is a flowchart illustrating an operating method of the error correction decoder 120 in accordance with an embodiment of the present disclosure.

Referring to FIG. 7, in step 701, the error correction decoder 120 may perform first error correction decoding on a target read row-vector corresponding to a target row-codeword among row-codewords belonging to a codeword group.

In step 703, the error correction decoder 120 may determine whether the first error correction decoding has succeeded. When it is determined that the first error correction decoding succeeds (Y at step 703), a decoded target row-codeword may be output in step 705.

When it is determined that the first error correction decoding fails (N at step 703), step 711 may be performed.

In step 711, the error correction decoder 120 may perform the first error correction decoding on the other row-codewords, excluding the target row-codeword, among the row-codewords belonging to the codeword group, i.e., reference read row-vectors corresponding to reference row-codewords.

In step 713, the error correction decoder 120 may determine whether each of symbols in read column-vectors is reliable, based on soft information corresponding to read row-vectors, which includes the target read row vector and a reference read row-vector, on which the first error correction decoding fails.

In step 715, the error correction decoder 120 may set symbols determined as reliable among the symbols in the read column-vectors as the symbols that are not error symbols, and perform second error correction decoding on the read column-vectors.

In step 717, the error correction decoder 120 may correct some of symbols in the target read row-vector, based on a result of the second error correction decoding, and perform the first error correction decoding on the target read row-vector.

FIG. 8 is a diagram illustrating a memory system 2000 in accordance with an embodiment of the present disclosure.

Referring to FIG. 8, the memory system 2000 may include a memory device 2200 configured to store data and a memory controller 2100 configured to control the memory device 2200 according to a request of a host 1000.

The host 1000 may be a device or system which stores data in the memory system 2000 or retrieves data from the memory system 2000. For example, the host 1000 may include at least one of a computer, a portable digital device, a tablet, a digital camera, a digital audio player, a television, a wireless communication device, and a cellular phone, but the embodiments of the present disclosure are not limited thereto.

The memory controller 2100 may control overall operation of the memory system 2000. The memory controller 2100 may perform various operations according to a request from the host 1000. The memory controller 2100 may perform a program operation of storing data in the memory device 2200, a read operation of reading data stored in the memory device 2200, and/or an erase operation of erasing data stored in the memory device 2200.

The memory controller 2100 may include a host interface 2110, a central processing unit 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the central processing unit 2120.

The host interface 2110 may perform communication with the host 1000 by using various interface protocols. For example, the host interface 2110 may communicate with the host 1000 by using at least one interface protocol among a Non-Volatile Memory express (NVMe), a Peripheral Component Interconnect-Express (PCI-e or PCIe), an Advanced Technology Attachment (ATA), a Serial ATA (SATA), a Parallel ATA (PATA), a Universal Serial Bus (USB), a Multi-Media Card (MMC), an Enhanced Small Disk Interface (ESDI), an Integrated Drive Electronics (IDE), a Mobile Industry Processor Interface (MIPI), a Universal Flash Storage (UFS), a Small Computer System Interface (SCSI), and a Serial Attached SCSI (SAS). However, the embodiments of the present disclosure are not limited thereto.

The central processing unit 2120 may perform various operations or generate a command and an address so as to control the memory device 2200. For example, the central processing unit 2120 may generate various commands and addresses for a program operation, a read operation, an erase operation, and the like, in response to a request received from the host 1000, and transmit the generated commands and addresses to the memory device 2200.

The central processing unit 2120 may convert or translate a logical address in the request received from the host 1000 into a physical address so as to control an operation of the memory device 2200. The central processing unit 2120 may convert a logical address into a physical address or convert a physical address into a logical address by using an address mapping table stored in the internal memory 2160. The central processing unit 2120 may update the address mapping table when new data is programmed to the memory device 2200 or when data stored in the memory device 2200 is erased.

The central processing unit 2120 may randomize data in a program operation, and de-randomize data in a read operation.

The memory interface 2130 may perform communication with the memory device 2200 by using any of various interface protocols.

The buffer memory 2140 may temporarily store data while the memory controller 2100 is controlling the memory device 2200. For example, program data received from the host 1000 may be temporarily stored in the buffer memory 2140 until a program operation is completed. In addition, data read from the memory device 2200 in a read operation may be temporarily stored in the buffer memory 2140.

The error correction circuit 2150 may perform error correction encoding on program data, and perform error correction decoding on read data. The error correction circuit 2150 may be the error correction circuit 100 shown in FIG. 5.

The internal memory 2160 may be used as a storage which stores various information for an operation of the memory controller 2100. The internal memory 2160 may store a plurality of tables. For example, the internal memory 2160 may store an address mapping table in which logical and physical addresses are mapped to each other.

The memory device 2200 may be implemented with a volatile memory device in which stored data is not retained when the supply of power is interrupted or a nonvolatile memory device in which stored data is retained even when the supply of power is interrupted. The memory device 2200 may perform a program operation, a read operation, an erase operation, and the like under the control of the memory controller 2100.

The memory device 2200 may include at least one storage area in which data is stored. The storage area may correspond to one page including a plurality of memory cells, one memory block including a plurality of pages, one plane including a plurality of memory blocks, or one die including a plurality of planes, but the embodiments of the present disclosure are not limited thereto.

Figure 9:
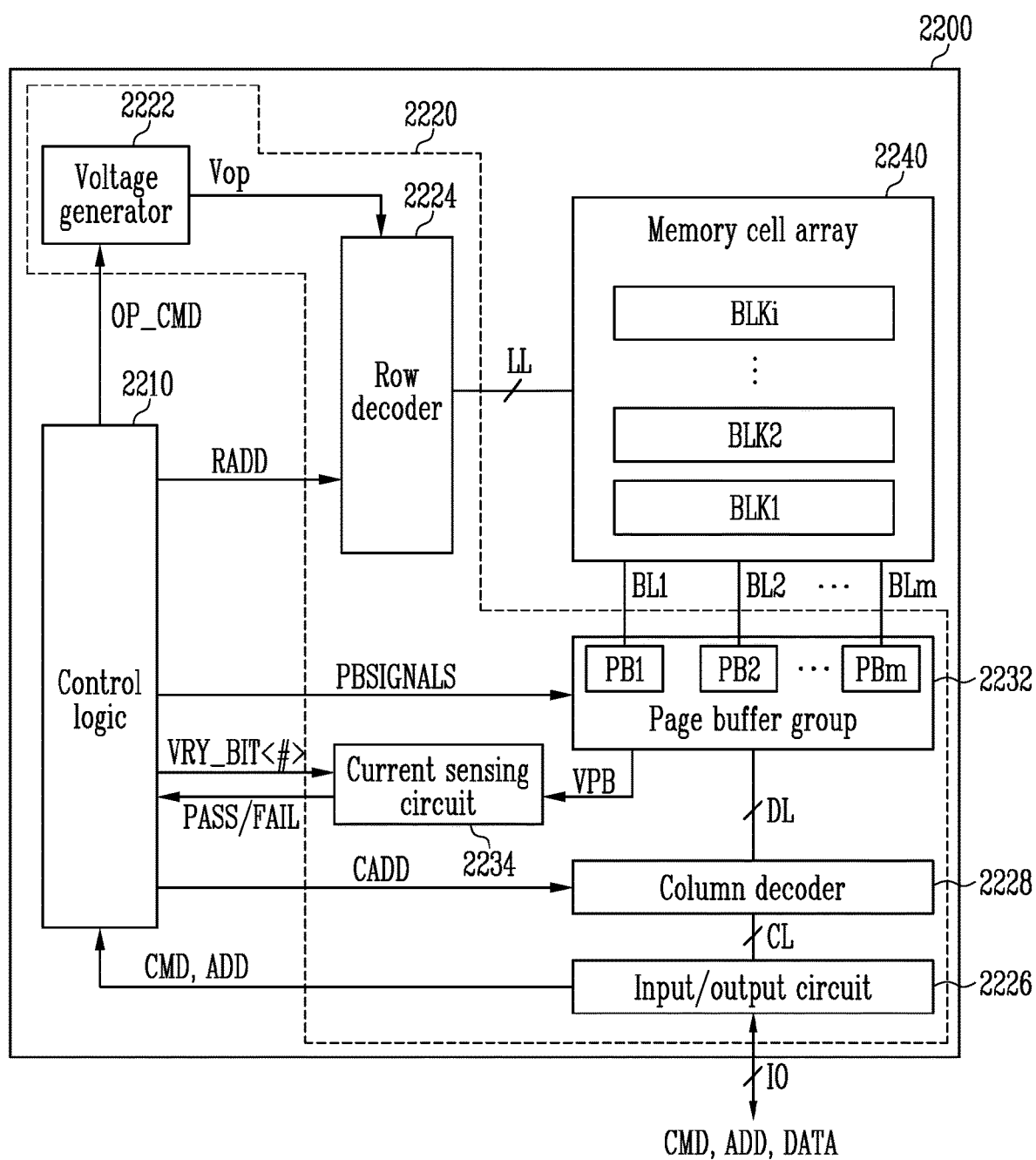

FIG. 9 is a diagram illustrating a memory device 2200 in accordance with an embodiment of the present disclosure.

Referring to FIG. 9, the memory device 2200 may include control logic 2210, a peripheral circuit 2220, and a memory cell array 2240. The peripheral circuit 2220 may include a voltage generator 2222, a row decoder 2224, an input/output circuit 2226, a column decoder 2228, a page buffer group 2232, and the current sensing circuit 2234.

The control logic 2210 may control the peripheral circuit 2220 under the control of the memory controller 2100 shown in FIG. 8.

The control logic 2210 may control the peripheral circuit 2220 in response to a command CMD and an address ADD, which are received from the memory controller 2100 through the input/output circuit 2226. For example, the control logic 2210 may output an operation signal OP_CMD, a row address RADD, a column address CADD, page buffer control signals PBSIGNALS, and an allow bit VRY_BIT<#> in response to the command CMD and the address ADD. The control logic 2210 may determine whether a verify operation has passed or failed in response to a pass or fail signal PASS or FAIL received from a current sensing circuit 2234.

The peripheral circuit 2220 may perform a program operation for storing data in the memory cell array 2240, a read operation for outputting data stored in the memory cell array 2240, and an erase operation for erasing data stored in the memory cell array 2240.

The voltage generator 2222 may generate various operating voltages Vop used in program, read, and erase operations in response to the operation signal OP_CMD received from the control logic 2210. For example, the voltage generator 2222 may transfer a program voltage, a verify voltage, a pass voltage, a read voltage, an erase voltage, a turn-on voltage, and the like to the row decoder 2224.

The row decoder 2224 may transfer the operating voltages Vop to local lines LL connected to a selected memory block among memory blocks of the memory cell array 2240 in response to the row address RADD received from the control logic 2210. The local lines LL may include local word lines, local drain select lines, and local source select lines. In addition, the local lines LL may include various lines such as a source line, which are connected to the memory block.

The input/output circuit 2226 may transfer the command CMD and the address ADD, which are received from the memory controller 2100, to the control logic 2210 through input/output lines 10, or exchange data DATA with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL, or exchange data with the input/output circuit 2226 through column lines CL.

The page buffer group 2232 may be connected to bit lines BL1 to BLm commonly connected to memory blocks BLK1 to BLKi. The page buffer group 2232 may include the page buffers PB1 to PBm connected to the bit lines BL1 to BLm. For example, one page buffer may be connected to each of the bit lines. The page buffers PB1 to PBm may operate in response to the page buffer control signals PBSIGNALS received from the control logic 2210. For example, in a program operation, the page buffers PB1 to PBm may temporarily store program data received from the memory controller 2100, and adjust a voltage applied to the bit lines BL1 to BLm according to the program data. Also, in a read operation, the page buffers PB1 to PBm may temporarily store data received through the bit lines BL1 to BLm, or sense a voltage or current of the bit lines BL1 to BLm.

The current sensing circuit 2234 may generate a reference current in response to the allow bit VRY_BIT<#> received from the control logic 2210 in a read or verify operation, and output a pass signal PASS or a fail signal FAIL by comparing a sensing voltage VPB received from the page buffer group 2232 with a reference voltage generated by the reference current.

The memory cell array 2240 may include a plurality of memory blocks BLK1 to BLKi in which data is stored. User data and various information required to perform an operation of the memory device 2200 may be stored in the memory blocks BLK1 to BLKi. The memory blocks BLK1 to BLKi may be implemented in a two-dimensional structure or a three-dimensional structure, and be configured identically to one another.

Figure 10:
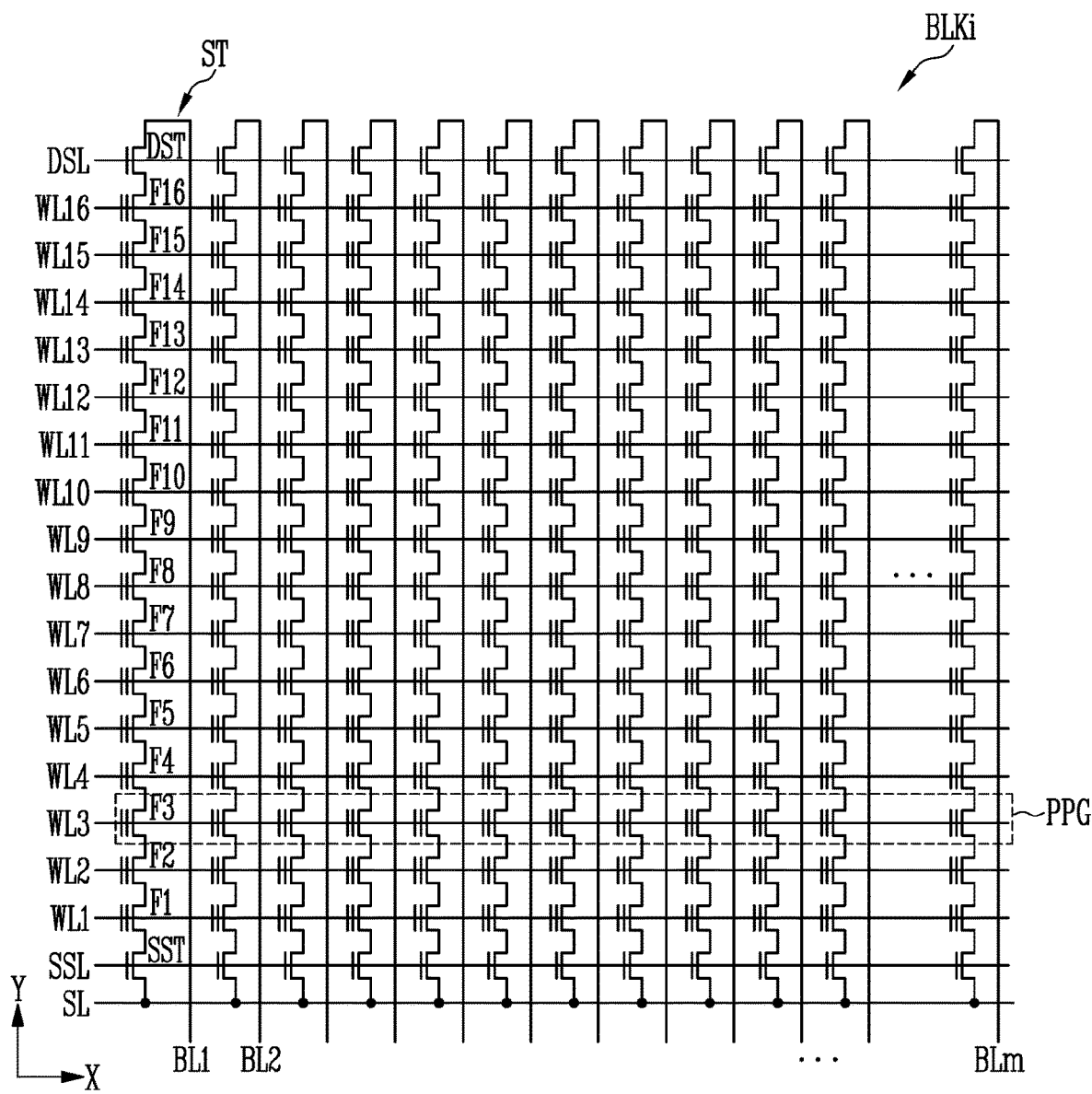

FIG. 10 is a diagram illustrating a memory block of a memory cell array.

The memory cell array may include a plurality of memory blocks, each of which is configured the same. Thus, one representative memory block BLKi among the plurality of memory blocks is illustrated in FIG. 10.

In the memory block BLKi, a plurality of word lines arranged in parallel to one another may be connected between a first select line and a second select line. The first select line may be a source select line SSL, and the second select line may be a drain select line DSL. Specifically, the memory block BLKi may include a plurality of strings ST connected between bit lines BL1 to BLm and a source line SL. The bit lines BL1 to BLm may be respectively connected to the strings ST, and the source line SL may be commonly connected to the strings ST. The strings ST may be configured identically to one another, and therefore, a string ST connected to a first bit line BL1 is described in detail as an example.

The string ST may include a source select transistor SST, a plurality of memory cells F1 to F16, and a drain select transistor DST, which are connected in series to each other between the source line SL and the first bit line BL1. At least one source select transistor SST and at least one drain select transistor DST may be included in one string ST, and more than the 16 memory cells F1 to F16 shown in the drawing may be included in one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST in different strings ST may be connected to the source select line SSL, gates of drain select transistors DST in different strings ST may be connected to the drain select line DSL, gates of the memory cells F1 to F16 in different strings ST may be connected to a plurality of word lines WL1 to WL16. A group of memory cells connected to the same word line among the memory cells in different strings ST may be a physical page PPG. Therefore, memory block BLKi may include the same number of physical pages PPG as word lines WL1 to WL16.

Figure 11:
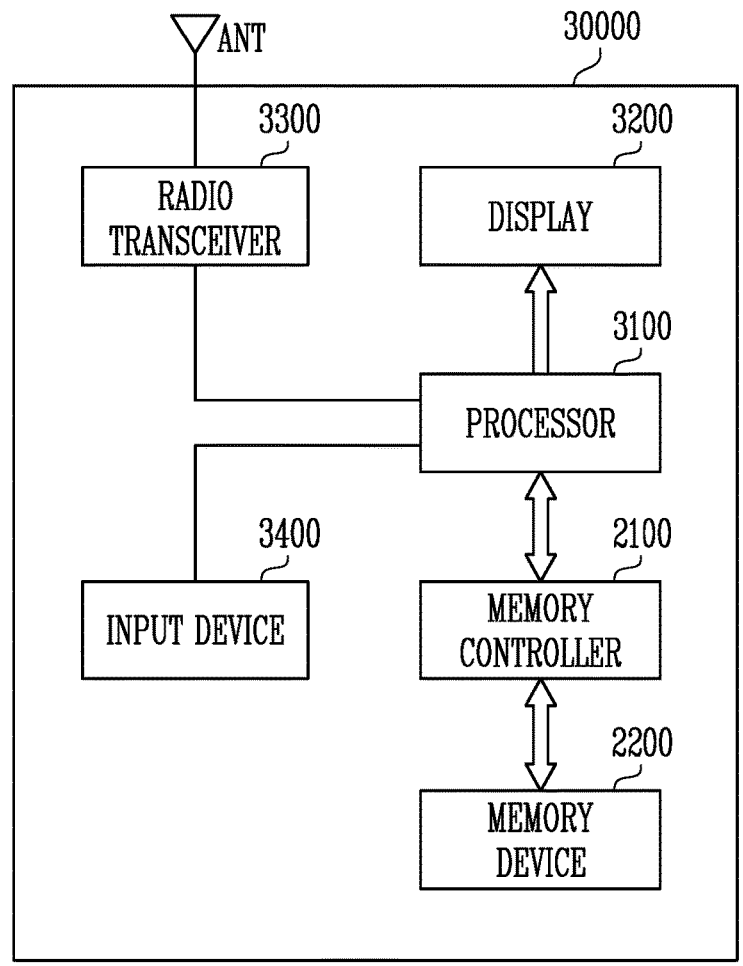

FIG. 11 is a diagram illustrating a memory system 30000 including the memory controller 2100 shown in FIG. 8.

Referring to FIG. 11, the memory system 30000 may be implemented as a cellular phone, a smart phone, a tablet PC, a personal digital assistant (PDA), or a wireless communication device. The memory system 30000 may include a memory device 2200 and the memory controller 2100 capable of controlling an operation of the memory device 2200.

The memory controller 2100 may control a data access operation of the memory device 2200, e.g., a program operation, an erase operation, a read operation, or the like under the control of a processor 3100.

Data programmed in the memory device 2200 may be output through a display 3200 under the control of the memory controller 2100.

A radio transceiver 3300 may transmit and receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 2100 or the display 3200. The memory controller 2100 may transmit the signal processed by the processor 3100 to the memory device 2200. Also, the radio transceiver 3300 may convert a signal output from the processor 3100 into a radio signal, and output the radio signal to an external device through the antenna ANT.

An input device 3400 is capable of inputting a control signal for controlling an operation of the processor 3100 or data to be processed by the processor 3100, and may be implemented as a pointing device such as a touch pad or a computer mouse, a keypad, a keyboard, or an image sensor.

The processor 3100 may control an operation of the display 3200 such that data output from the memory controller 2100, data output from the radio transceiver 3300, or data output from the input device 3400 can be output through the display 3200.

In some embodiments, the memory controller 2100 capable of controlling an operation of the memory device 2200 may be implemented as a part of the processor 3100, or be implemented as a chip separate from the processor 3100.

FIG. 12 is a diagram illustrating a memory system 70000 including the memory controller 2100 shown in FIG. 8.

Referring to FIG. 12, the memory system 70000 may be implemented as a memory card or a smart card. The memory system 70000 may include a memory device 2200, the memory controller 2100, and a card interface 7100.

The memory controller 2100 may control data exchange between the memory device 2200 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 2100 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the memory controller 2100 under the control of a microprocessor 6100.

In accordance with embodiments of the present disclosure, error correction capability of an error correction circuit can be improved.

What is claimed is:

1. An error correction circuit comprising:
a first error correction encoder configured to generate a plurality of row-codewords by performing first error correction encoding on each of a plurality of messages;
a second error correction encoder configured to organize m-bit symbols by grouping p-bit symbols in each of row-codewords in a unit of a column layer including m columns, and generate a plurality of column-codewords by performing second error correction encoding on each of symbol groups configured with m-bit symbols belonging to the same column layer among the m-bit symbols, where each of p and m is a natural number;
a first error correction decoder configured to perform first error correction decoding on each of read row-vectors corresponding to the plurality of row-codewords, and output soft information of the first error correction decoding, corresponding to each of p-bit symbols in each of read row-vectors on which the first error correction decoding fails; and
a second error correction decoder configured to determine whether each of m-bit symbols in read column-vectors corresponding to the column-codewords is reliable, based on the soft information corresponding to each of the p-bit symbols, and perform second error correction decoding on the read column-vectors, based on the determination of whether each of the m-bit symbols is reliable.

2. The error correction circuit of claim 1, wherein the soft information of the first error correction decoding includes a flipping function value of a variable node corresponding to each of the p-bit symbols in the read row-vectors.

3. The error correction circuit of claim 1, wherein the soft information of the first error correction decoding includes a posteriori probability (APP) of a variable node corresponding to each of the p-bit symbols in the read row-vectors.

4. The error correction circuit of claim 1, wherein, when the first error correction decoding performed by the first error correction decoder succeeds, a target row-codeword decoded by the first error correction decoder is output.

5. The error correction circuit of claim 1, wherein the second error correction decoder performs the second error correction decoding by setting an m-bit symbol, which is determined to be reliable, among the m-bit symbols, as a non-error symbol.

6. The error correction circuit of claim 1, wherein the second error correction decoder determines that the m-bit symbol is reliable, when a reliability of select p-bit symbols is greater than or equal to a set value, the number of the select p-bit symbols being greater than or equal to a set number, among the p-bit symbols in the m-bit symbol.

7. The error correction circuit of claim 1, wherein the first error correction decoder performs the first error correction decoding on a read row-vector including p-bit symbols in an m-bit symbol corrected by the second error correction decoding among the read row-vectors on which the first error correction decoding fails.

8. The error correction circuit of claim 1, wherein each of the column-codewords is a codeword of a maximum distance separable (MDS) code.

9. The error correction circuit of claim 8, wherein the second error correction decoding includes at least one of error decoding and erasure decoding.

10. The error correction circuit of claim 9, wherein, when a number of m-bit symbols determined as unreliable symbols among the m-bit symbols in each of the read column-vectors is less than or equal to A as an erasure correction capability of the MDS code, the second error correction decoder performs the erasure decoding on the read column-vector, where A is a natural number.

11. The error correction circuit of claim 9, wherein, when a number of m-bit symbols determined as unreliable symbols among the m-bit symbols in each of the read column-vectors is less than or equal to B as an error correction capability of the MDS code, the second error correction decoder performs the error decoding on the read column-vector, where B is a natural number.

12. A method for operating an error correction circuit, the method comprising:
generating a plurality of row-codewords by performing first error correction encoding on each of a plurality of messages;
organizing m-bit symbols by grouping p-bit symbols in each of row-codewords in a unit of a column layer including m columns, where each of p and m is a natural number;
generating a plurality of column-codewords by performing second error correction encoding on each of symbol groups configured with m-bit symbols belonging to the same column layer among the m-bit symbols;
performing first error correction decoding on each of read row-vectors corresponding to the plurality of row-codewords;
determining whether each of m-bit symbols in read column-vectors corresponding to the column-codewords is reliable, based on soft information of the first error correction decoding, which corresponds to each of p-bit symbols in each of read row-vectors on which the first error correction decoding fails; and
performing second error correction decoding on the read column-vectors, based on the determination of whether each of the m-bit symbols is reliable.

13. The method of claim 12, wherein the soft information of the first error correction decoding includes a flipping function value of a variable node corresponding to each of the p-bit symbols in the read row-vectors.

14. The method of claim 12, wherein the soft information of the first error correction decoding includes a posteriori probability (APP) of a variable node corresponding to each of the p-bit symbols in the read row-vectors.

15. The method of claim 12, wherein the performing of the second error correction decoding includes performing the second error correction decoding by setting an m-bit symbol, which is determined to be reliable, among the m-bit symbols, as a non-error symbol.

16. The method of claim 12, wherein the determining of whether each of the m-bit symbols is reliable includes determining that the m-bit symbol is reliable when a reliability of p-bit symbols, the number of which is greater than or equal to a set number, among the p-bit symbols in the m-bit symbol, is greater than or equal to a set value.

17. The method of claim 12, further comprising performing the first error correction decoding on a read row-vector including p-bit symbols in an m-bit symbol corrected by the second error correction decoding among the read row-vectors on which the first error correction decoding fails.

18. The method of claim 12, wherein each of the column-codewords is a codeword of a maximum distance separable (MDS) code.

19. The method of claim 18, wherein the second error correction decoding includes at least one of error decoding and erasure decoding.

20. The method of claim 19, wherein the performing of the second error correction decoding includes performing the erasure decoding on the read column-vector, when a number of m-bit symbols determined to be unreliable, among the m-bit symbols in each of the read column-vectors, is less than or equal to A as an erasure correction capability of the MDS code, where A is a natural number.

21. The method of claim 19, wherein the performing of the second error correction decoding includes performing the error decoding on the read column-vector, when a number of m-bit symbols determined as unreliable symbols among the m-bit symbols in each of the read column-vectors is less than or equal to B as an error correction capability of the MDS code, where B is a natural number.

* * * * *